United States Patent [19]

Pfiffner

[11] Patent Number: 4,682,343

[45] Date of Patent: Jul. 21, 1987

[54] PROCESSING CIRCUIT WITH ASYMMETRY CORRECTOR AND CONVOLUTIONAL ENCODER FOR DIGITAL DATA

[75] Inventor: Harold J. Pfiffner, Los Angeles, Calif.

[73] Assignee: The United States of America as represented by the Administrator of the National Aeronautics and Space Administration, Washington, D.C.

[21] Appl. No.: 649,327

[22] Filed: Sep. 11, 1984

[51] Int. Cl.$^4$ .................. H04L 27/40; G06F 11/10
[52] U.S. Cl. .................................. 375/59; 371/43; 375/54; 375/76; 375/120
[58] Field of Search .............. 375/76, 108, 118, 119, 375/120, 59, 95, 106; 371/43, 44, 45, 46, 39, 54

[56] References Cited

U.S. PATENT DOCUMENTS

| | | | |
|---|---|---|---|
| 3,423,729 | 1/1969 | Heller | 375/58 |
| 3,473,131 | 10/1969 | Perkins Jr. | 375/76 |
| 3,538,497 | 11/1970 | Harmon | 371/43 |
| 4,017,803 | 4/1977 | Baker | 375/95 |
| 4,055,832 | 10/1977 | En | 371/43 |
| 4,087,787 | 5/1978 | Acampora | 371/43 |
| 4,143,354 | 3/1979 | Stoddart | 371/22 |
| 4,151,854 | 4/1979 | La Fratta | 375/120 |
| 4,193,062 | 3/1980 | En | 371/43 |
| 4,215,245 | 7/1980 | Bellisio | 375/120 |
| 4,270,208 | 5/1981 | MacDavid | 375/76 |
| 4,293,951 | 10/1981 | Rhodes | 371/43 |
| 4,400,667 | 8/1983 | Belkin | 375/120 |
| 4,423,520 | 12/1983 | Murayama et al. | 375/95 |
| 4,456,890 | 6/1984 | Carickhoff | 375/120 |
| 4,462,101 | 7/1984 | Yasuda et al. | 371/43 |
| 4,606,050 | 8/1986 | Sekigawa et al. | 375/95 |

OTHER PUBLICATIONS

NASA Tech Briefs, vol. 7, No. 4, Summer 1983, pp. 378-379, "NRZ Data Asymmetry Correction and Convolutional Encoder" and NASA Technical Support Package, vol. 7, No. 4, Summer 1983, MSC-20187 (same title).

*Primary Examiner*—Benedict V. Safourek
*Attorney, Agent, or Firm*—Hardie R. Barr; John R. Manning; Edward K. Fein

[57] ABSTRACT

A processing circuit (P) is provided for correcting for input parameter variations, such as data and clock signal asymmetry, phase offset and jitter, noise and signal amplitude, in incoming data signals. An asymmetry corrector circuit (C) performs the correcting function and furnishes the corrected data signals to a convolutional encoder circuit (E). The corrector circuit (C) further forms a regenerated clock signal from clock pulses in the incoming data signals and another clock signal at a multiple of the incoming clock signal. These clock signals are furnished to the encoder circuit (E) so that encoded data may be furnished to a modulator (M) at a high data rate for transmission.

8 Claims, 7 Drawing Figures

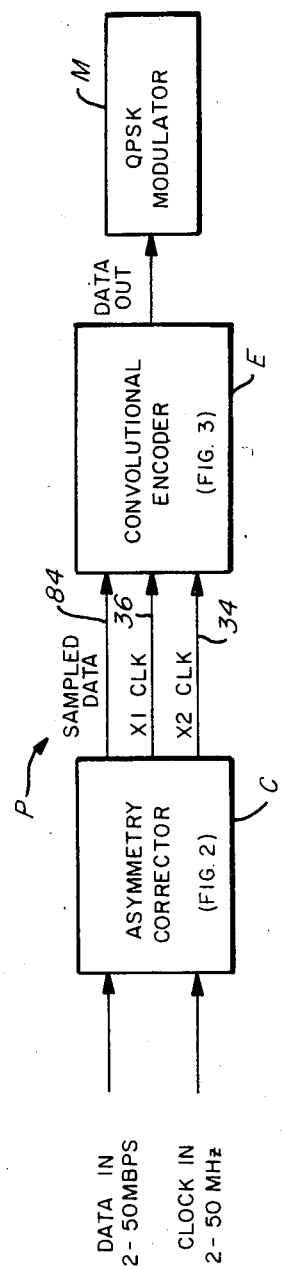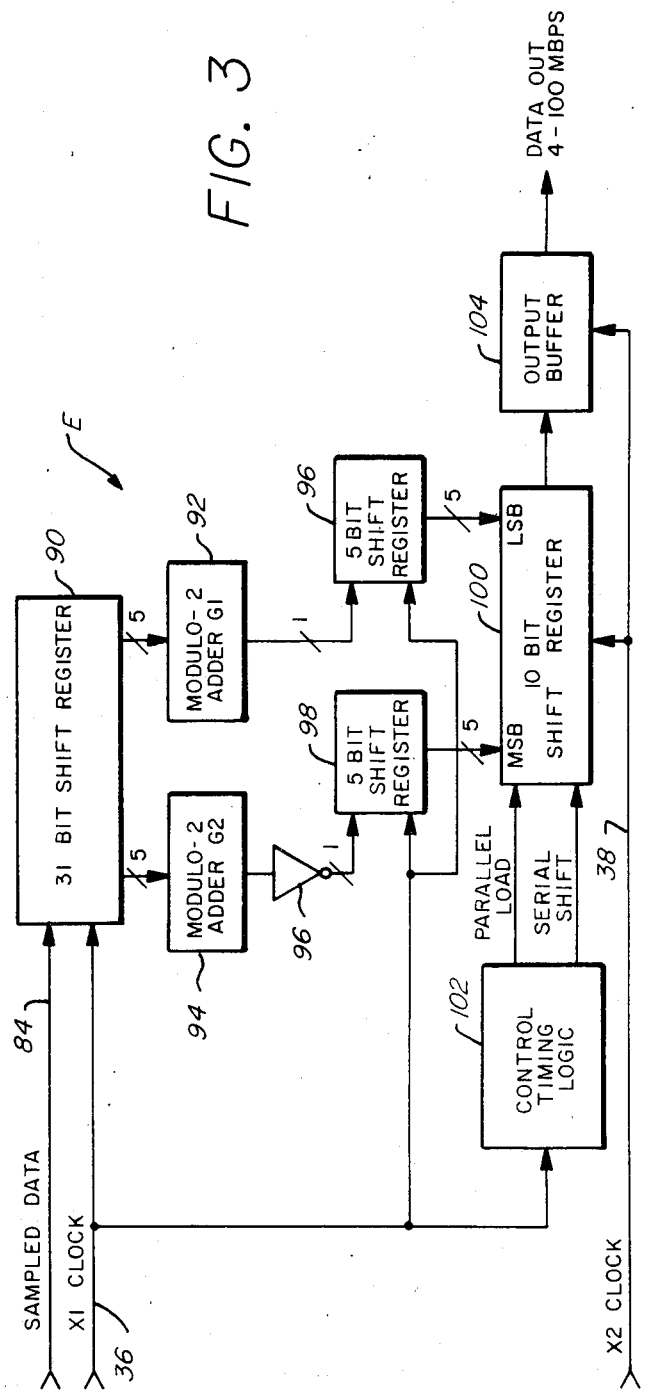

$$\%\text{ASYMMETRY} \equiv \frac{A-B}{A+B} \times 100$$

PROCESSING CIRCUIT WITH ASYMMETRY CORRECTOR AND CONVOLUTIONAL ENCODER FOR DIGITAL DATA

ORIGIN OF THE INVENTION

The invention described herein was made on the performance of work under a NASA contract and is subject to the provision of Section 305 of the National Aeronautics and Space Act of 1958, Public Law 85-568 (72 Stat. 435; 42 U.S.C. 2457).

TECHNICAL FIELD

The present invention relates to processing of signals, specifically compensation for input signal parameter variations in received digital data which contribute to degradation of data link performance. After such compensation is made, the data stream is convolutionally encoded at a higher data rate for subsequent transmission.

BACKGROUND ART

In digital data transmission links, input signal parameter variations may occur which contribute to degradation of link performance. For various reasons the received data signal and its associated clock signal may include separately variable parameters as could occur when they are transmitted over separate signal paths. Typical signal parameter variations thus would include data signal asymmetry and clock signal asymmetry, phase offset and jitter, noise, signal amplitude variations and the like. It was desirable to correct for these variations prior to encoding to insure accuracy in the encoded data. Previous approaches used a four-phase clock adjustment scheme in conjunction with a phase locked loop for phase positioning the data signal with the clock signal, but resolution was inadequate. Also, there was no capability of recognition possible frequency mislock conditions in the phase locked loop. Further, no provision was made for compensating for cable loss and signal rise/fall time effects on data asymmetry.

Various convolutional encoding techniques for error detection and correction in digital data have been proposed in the prior art. Those known are U.S. Pat. Nos. 4,055,832; 4,143,354; 4,193,062; and 4,293,951.

DISCLOSURE OF THE INVENTION

In accordance with the present invention, a processing circuit is provided which includes an asymmetry corrector circuit and a convolution encoder circuit. Together, these circuits permit receiving of digital data, such as NRZ coded data, at rates on the order of two to fifty megabits per second. Input signal parameter variations which might contribute to degradation of data link performance are continuously compensated for in the asymmetry corrector circuit. The corrected data pulses are then fed from the asymmetry corrector circuit to the convolution encoder circuit where convolutional encoding is performed. Subsequent data transmission can then take place at a higher multiple rate, such as twice the input data rate, with the circuits of the present invention. Tests conducted with input data and clock signals whose parameters varied to simulate worst case timing conditions indicate a significant decrease in data asymmetry between input and output data with the present invention.

BRIEF DESCRIPTION OF DRAWINGS

FIG. 1 is a simplified schematic circuit diagram of a processing circuit according to the present invention used in connection with a modulator;

FIG. 3 is a schematic circuit diagram of a convolutional encoder circuit of the circuit of FIG. 1;

BEST MODE FOR CARRYING OUT THE INVENTION

Figure 2:
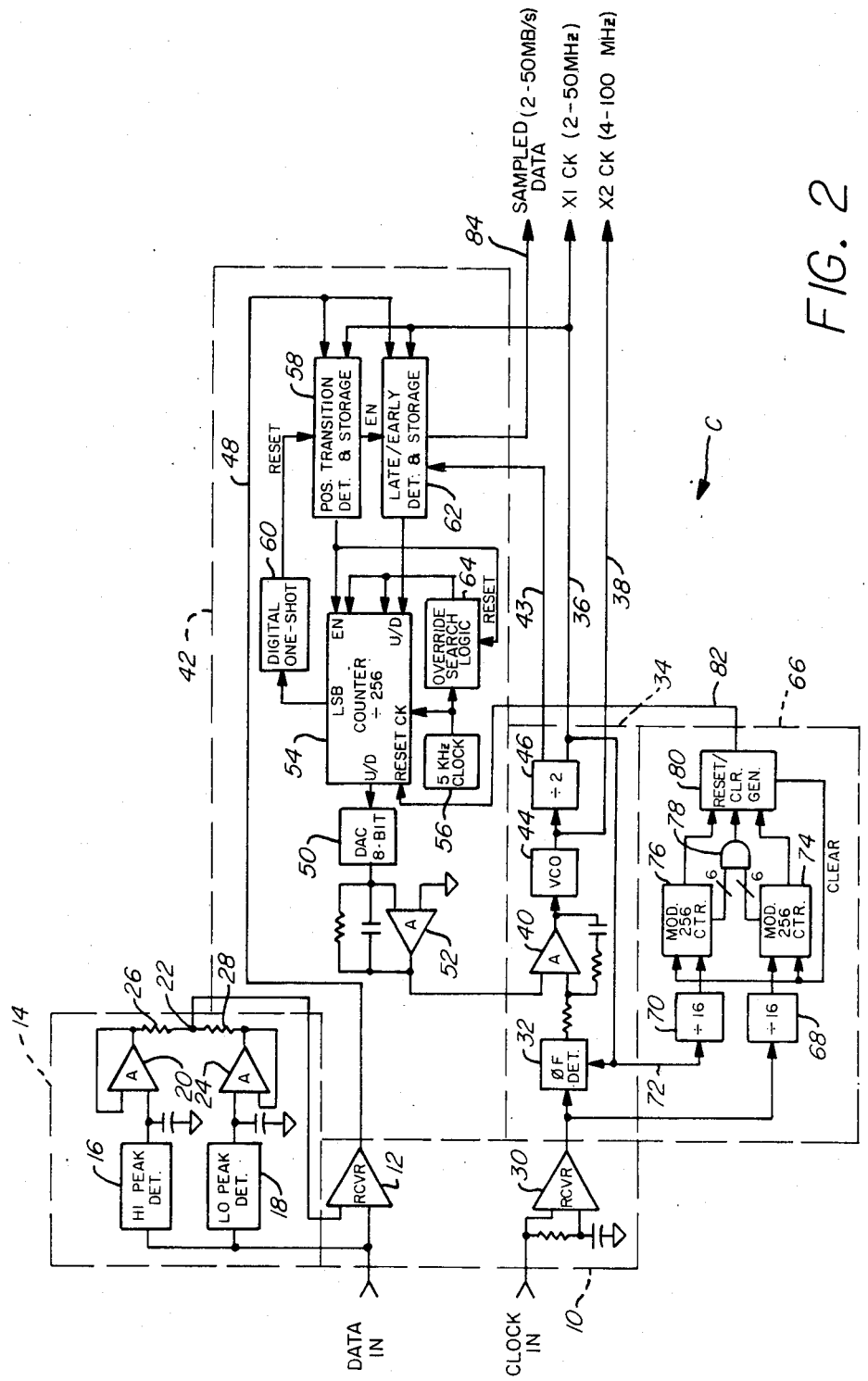
FIG. 2 is a schematic circuit diagram of an asymmetry corrector circuit of the circuit of FIG. 1.

In the drawings, the letter P (FIG. 1) designates generally a signal processing circuit for processing input digital data and providing the processed digital data to a modulator M for subsequent transmission. In the embodiment shown in the diagrams, the modulator M is shown as a quaternary phase-shift keyed (QPSK) modulator, although it should be understood that other types of modulation might be used, if desired. The incoming data to the processing circuit P can be any suitable form of digital data, such as NRZ coded data, and typically is at a very high rate, on the order of two to fifty megabits per second.

Figure 5:
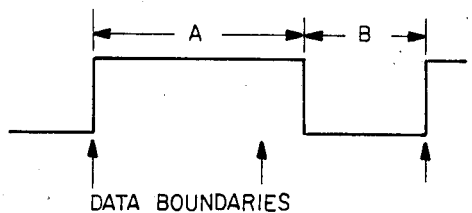
FIGS. 5, 6 and 7 are waveform diagrams illustrative of the operation of the present invention.

Input signal parameter variations occur in both the incoming data and clock and may contribute from time to time to degradation of the data link performance thus requiring continuous correction. Typical signal parameter variations include data and clock signal asymmetry, phase offset and jitter, noise, signal amplitude variations and the like. Signal asymmetry according to the present invention is illustrated in FIG. 5. There, pulses in adjacent bit times A and B exemplify pulses which are expected to occur at intervals indicated by the designated data boundaries but which actually occur as shown. The asymmetry between the pulses A and B is defined to be the difference between their duration divided by the sum of their duration. It can also be expressed as a percentage, as indicated.

Any parameter variations, such as asymmetry, which may occur are compensated for in an asymmetry corrector circuit C of the signal processing circuit P. The corrector circuit C continuously corrects for these variations prior to furnishing the corrected data to a convolutional encoder circuit E for encoding. The encoder circuit E is preferably a modulo-two encoder for error checking and correction of the digital data on receipt. The corrector circuit C further forms a regenerated clock signal and an increased frequency clock signal at a multiple of the regenerated clock signal, so that the encoded data may be furnished from the encoder circuit E to the modulator M at a multiple, such as twice, the frequency of the incoming data to the processing circuit P.

In the corrector circuit C (FIG. 2), a receiver circuit 10 receives incoming data pulses in a data receiver amplifier 12. Incoming data pulses to the receiver circuit 10 are further furnished to an adaptive threshold detector circuit 14 which detects input logic high level signals with a high peak detector circuit 16 and input logic low data level signals with a low peak detector circuit 18. The detected input logic high level in detector circuit 16 is furnished through an amplifier 20 to a common point 22. Similarly, the detected input logic low level is furnished through an amplifier 24 to common point 22. Resistors 26 and 28 are provided at the outputs of amplifiers 20 and 24, so that the voltage level present at the common point 22 represents a direct current reference voltage centered between the two detected input logic levels. This direct current reference level is then furnished to the receiver amplifier 12 to serve as a threshold level for the input data level at a midway point, or fifty percent, between the detected input logic high and low data levels. In this way, a condition defined as minimum input asymmetry is defined. The adaptive threshold detector 14 thus provides an optimum slicing voltage for data receiver amplifier 12 which is maintained as input logic levels change as different data sources provides data signals to the processing circuit P.

Figure 7:
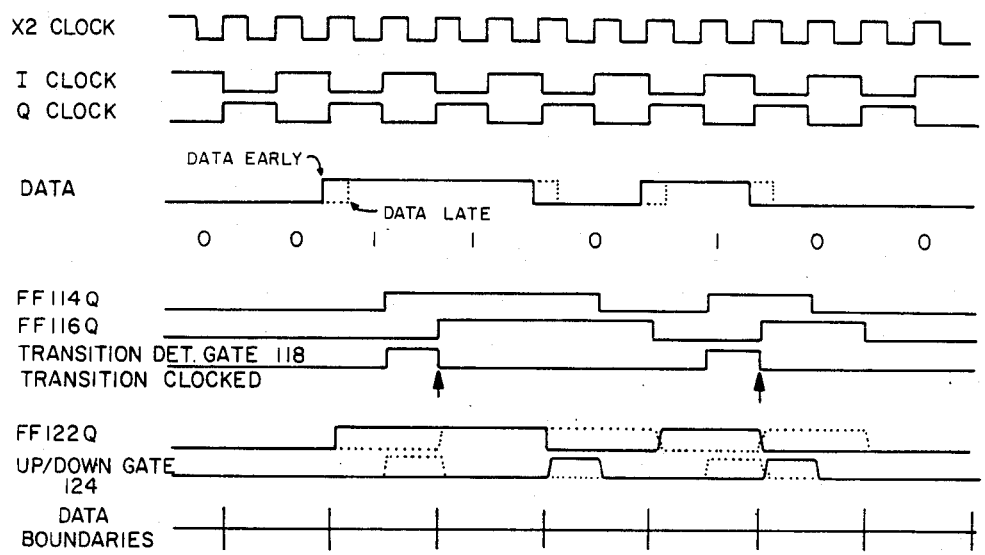

Clock pulses in the incoming signals to the corrector circuit C are received in a clock receiver amplifier 30 and furnished to a phase-frequency detector circuit 32 of a phase-locked loop 34. The phase-locked loop 34 forms a regenerated clock signal X1 CLOCK at the original incoming data rate which is furnished over an output conductor 36 to the encoder circuit E. Further, the phase-locked loop 34 forms a clock signal X2 CLOCK (FIG. 7) at a multiple of the incoming data frequency, such as twice, which is furnished over a conductor 38 (FIGS. 2 and 3) to the encoder circuit E, for reasons to be set forth.

An integrator amplifier 40 in the phase-locked loop 34 controls the phase of the regenerated clock signal with respect to the incoming data pulses. The integrator amplifier 40 receives the output from a phase-frequency detector circuit 32 as well as a direct current feedback voltage, formed within a mid-bit corrector circuit 42 in a manner to be set forth below, forming an output differential signal which is furnished to a voltage controlled oscillator 44 in the phase-locked loop 34. The voltage controlled oscillator 44 operates at a frequency which is a multiple, such as twice, the incoming data frequency and provides the increased frequency signal over the conductor 38 to the encoder circuit E. The output of the voltage controlled oscillator 44 is also furnished to a frequency divider circuit 46 where the output frequency of oscillator 44 is divided down to the original incoming data rate. Pulses at the incoming data rate, X1 CLOCK, are provided over the conductor 36 to the encoder circuit E. X1 CLOCK pulses on the conductor 36 are provided as a clock signal Q CLOCK (FIG. 7) to the mid-bit correction circuit 42. An inverted version, I CLOCK, of the Q CLOCK signal is also furnished over a conductor 43 to mid-bit correction circuit 42.

The mid-bit corrector circuit 42 continuously adjusts the phase of the output of the voltage controlled oscillator 44 relative to data transitions in the incoming data signals until phase coincidence is achieved between clock pulses on conductor 36 and data pulses (FIG. 7) from receiver amplifier 12 on conductor 48. A digital-to-analog (D/A) converted 50 in the mid-bit corrector circuit 42 generates a direct current feedback voltage which is provided through an amplifier 52 to the integrator amplifier 40 in the phase-locked loop 34. The feedback voltage generated in the mid-bit corrector 42 is summed with the output of phase-frequency detector 32 at the integrator amplifier 40 of the phase-locked loop 34, driving the oscillator 44. This summing function driving oscillator 44 causes its output phase to adjust to a point that the phase-frequency detector 32 output generates an opposing voltage to that provided by mid-bit corrector 42. The amount of phase shift is thus directly proportional to the feedback voltage level from corrector circuit 42.

The mid-bit corrector circuit 42 adjusts, for reasons to be set forth below, the phase of output of oscillator 44 relative to data transitions until phase coincidence is achieved between clock pulses on conductor 36 and data pulses on conductor 48. The amplitude of the phase-correcting feedback signal from converter 50 is generated in a reversible up/down digital counter 54. The counter 54 is driven by a relatively low frequency clock 56, such as a five kilohertz clock.

Figure 4:
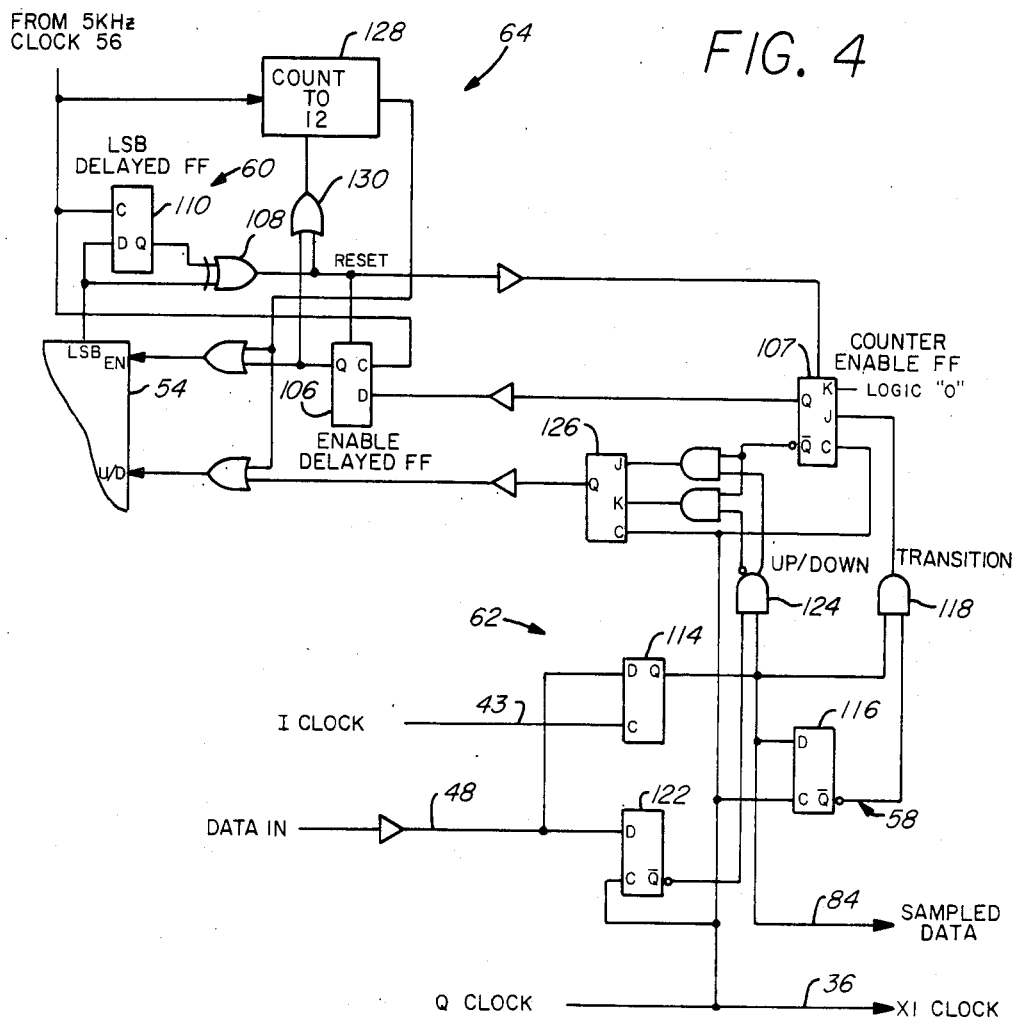
FIG. 4 is a schematic circuit diagram of a portion of the corrector circuit of FIG. 2.

In the preferred embodiment of the present invention, using logic circuitry (FIG. 4), phase coincidence is detected as being achieved when the positive going edges of the clock signal on the conductor 36 and the data signal on the conductor 48 coincide. The data pulses on the conductor 48 are furnished to a positive transition detector and storage circuit 58 which detects the first positive data transition following receipt of a reset signal from a digital one-shot circuit 60. A signal representing the occurrence of this data transition is stored, and in consequence the counter 54 is provided an enabling signal at an enable or EN input thereto. An enabling signal is also provided on the occurrence of the first positive data transition from the positive transition detection circuit 58 to a late/early detector and storage circuit 62. The late/early detector circuit 62 receives data pulses over the conductor 48 and clock pulses over the conductor 36. Depending on whether the clock pulses on conductor 36 are early or late in phase relationship to the data pulses on conductor 48, a signal is formed and provided to an up/down, or U/D, control terminal to the counter 54.

Thus, the first positive transition in a data pulse after the detector circuit 58 has been reset by one-shot circuit 60 enables the counter 54, and the counter 54 begins to increment to contents at the rate determined by the clock circuit 56. The direction in which the count is incremented, either up or down, is determined by the signal furnished to the counter 54 from the late/early detector circuit 62 based on the phase relationship between data and clock pulses. The counter 54 increments its count in a direction to reduce the detected phase error between positive transition of the data signal and the clock signal. The increase or decrease in the count stored in the counter 54 occurs only one count at a time, since each time the least significant bit (LSB) changes digital one-shot circuit 60 resets transition detector circuit 58, inhibiting detection. This inhibition allows the phase-locked loop 34 to settle following a change in level from converter 50 for the duration of one cycle of clock 56 before the next phase comparison between clock signals and data signals is permitted.

The mid-bit corrector circuit 42 includes an override circuit 64 which ensures the detection of data patterns in the form of narrow pulses of one bit time or less. For example, the clock pulses on conductor 36 and data pulses on conductor 48 may be so phase displaced that positive transition detector circuit 58 does not detect the presence of any positive data transition. The data and clock pulses thus will not properly align and the data readings will be in error. If such a condition exists, the override search logic circuit 64 automatically increments the counter 54 one count at a set rate, such as every 2.4 milliseconds, depending on data rates. This incrementing of the contents of counter 54 continues until the relative phase between the clock and data pulses is changed to allow positive data transitions to be detected.

When the next positive data transition is detected, the positive transition detector circuit 58 resets the override search logic circuits 64. During normal operation, positive data transitions occur at least once every two milliseconds and thus the override search logic circuit 64 is continually inhibited from erroneously incrementing the counter 54. Details of the digital logic of circuits 58, 60, 62 and 64 are set forth below in the description of the circuitry of FIG. 4.

The corrector circuit C further includes a frequency mislock detector circuit 66 to detect possible false frequency lock conditions of the phase-locked loop 34. This type of condition can occur when a phase offset between input and output frequencies is being commanded by the voltage from amplifier 52 provided to phase-locked loop 34 concurrently with a step change in input frequency or an off/on cycling of operating power to the circuit C. A frequency divider 68 divides the incoming clock pulses by a suitable rate, while a frequency divider 70 divides the output clock signal furnished over conductor 72 from phase-locked loop 34 by the same rate.

The output pulses from the frequency dividers 68 and 70 are furnished to modulo two-hundred fifty six counters 74 and 76, respectively. The six most significant bits in the counters 74 and 76 are furnished to a multiport AND gate 78 where they are compared at the time that one of the two counters has reached its full-scale count. At this time, in the event that six most significant bits of the counters 74 and 76 match, gate 78 indicates this condition to reset generator 80 which provides a CLEAR signal to reset the counters 74 and 76 and the counting process continues.

In the event that gate 78 detects a mismatch between counters 74 and 76, the reset generator circuit 80 provides a reset signal over a conductor 82 to a reset terminal of the counter 54 in mid-bit corrector circuit 42, returning the phase offset between the input and output frequencies to zero, and counting operations resume until a proper phase/frequency lock occurs.

Once the proper phase/frequency lock occurs, the detector circuit 62 provides sampled data at the incoming data rate over a conductor 84 to the convolutional encoder circuit E. The incoming data and X1 CLOCK and X2 CLOCK signals are buffered in conventional buffer logic gates before being furnished to the encoder circuit E.

In the encoder circuit E (FIG. 3), the sampled data pulses in the conductor 84 are read into a multi-bit shift register 90 in serial fashion by X1 CLOCK pulses present on the conductor 36. In the preferred embodiment, thirty-one bits are contained in the shift register 90. Five bits of the data in shift register 90 are transferred to a first modulo-two adder circuits 92, and five bits of the data in shift register 90 are also transferred to a second modulo-two adder 94. Of the five bits in shift register 90 transferred to adders 92 and 94, four are common and one is distinct from the data bit transferred to the other modulo-two adder.

In an embodiment where the shift register 90 carries thirty-one stages, the first, eleventh, sixteenth and thirty-first stages are transferred in common to each of modulo-two adders 92 and 94, while the data bits in stage six are transferred uniquely to adder 92 and the data bits in stage twenty-six of the shift register 90 are transferred uniquely to adder 94. The contents of the shift register 90 transferred to adder 94 are inverted create a minimum transition density before further transfer, as indicated schematically as an inverter 95. This inversion function can be accomplished by inverting the data bits of stage twenty-six of shift register 90 prior to addition, if desired. This is done to maintain an overall level of gating of three for each of the adders 92 and 94 and avoid creation of any difference in signal delay paths in these adders in view of the clock rates used. This encoding circuit produces an encoded bit stream representative of the incoming data stream wherein consecutive bits of the incoming data stream are represented by consecutive fifth bits of the encoded stream, i.e., there are four intervening encoded bits between any two encoded bits which represent consecutive received data bits.

The modulo-two addition in adders 92 and 94 is accomplished with Exclusive OR gates and the results of such modulo-two addition are transferred to shift registers 96 and 98, respectively. Shift registers 96 and 98 are serial in/parallel out shift registers reading in data in a serial manner at the incoming data clock rate X1 CLOCK on conductor 36. Shift registers 96 and 98 can be implemented, for example, by a four bit universal shift register and a D-flip flop. Shift registers 96 and 98 are serially loaded for five consecutive pulses of the data rate clock on conductor 36 and then simultaneously transferred in parallel to a ten bit shift register 100. The contents of shift register 98 are transferred into the five most significant bit positions of shift register 100, while the contents of shift register 96 are transferred to the five least significant bit positions of shift register 100.

Shift register 100 is a parallel in/serial out shift register, in the preferred embodiment taking the form of ten D-flip flops and OR gates for serial/parallel selection. Shift register 100 is provided with clock signals at the double data rate X2 CLOCK present on the conductor 38. Parallel loading and serial shifting signals for the shift register 100 is provided by a control timing logic circuit 102.

Control timing logic circuit 102 takes the form of a divide by five counter which is driven by the data rate clock signal on conductor 36. The output of the divide by five counter is gated with the clock signal present on conductor 36 to form a pulse whose width corresponds to the width of the X2 CLOCK signals on conductor 38 and occurs simultaneously with every tenth clock pulse on conductor 38. Shift register 100 is loaded with parallel data bits from shift registers 96 and 98 by one clock pulse from conductor 38, followed by nine pulse intervals of serial data shifting, producing a convolutionally encoded serial data stream at the output of shift register 100 which is furnished to an output buffer circuit 104. Buffer circuit 104 is provided as an interface between the shift register 100 and the quaternary phase-shift keyed modulator M. In the buffer circuit 104, the encoded data stream is clocked into a high speed D-flip flop by the X2 CLOCK pulses present on the conductor 38. The flip flop in buffer circuit 104 is of the type having a very short propagation delay time on the order of 1.0 nanosecond, with rise and fall times between the twenty percent and eighty percent level of on the order of 0.8 nanoseconds. This range between maximum and minimum propagation delays, as well as rise and fall times is thus on the order of 0.5 nanoseconds. The characteristics in the output buffer 104 serve to minimize component induced output asymmetry.

As has been set forth above, the purpose of the mid-bit corrector circuitry 42 is to phase position the X1 CLOCK on conductor 36 until the leading edges of the Q CLOCK coincide with the positive-going edges of data transmissions. At this time, the leading edges of the I CLOCK signal on conductor 43 can be used to reliably sample incoming data. This is accomplished by injecting a variable direct current control voltage from converter 50 into the integrator amplifier 40 to adjust the phase of the output of the voltage controlled oscillator 44 relative to data transitions.

Figure 6:
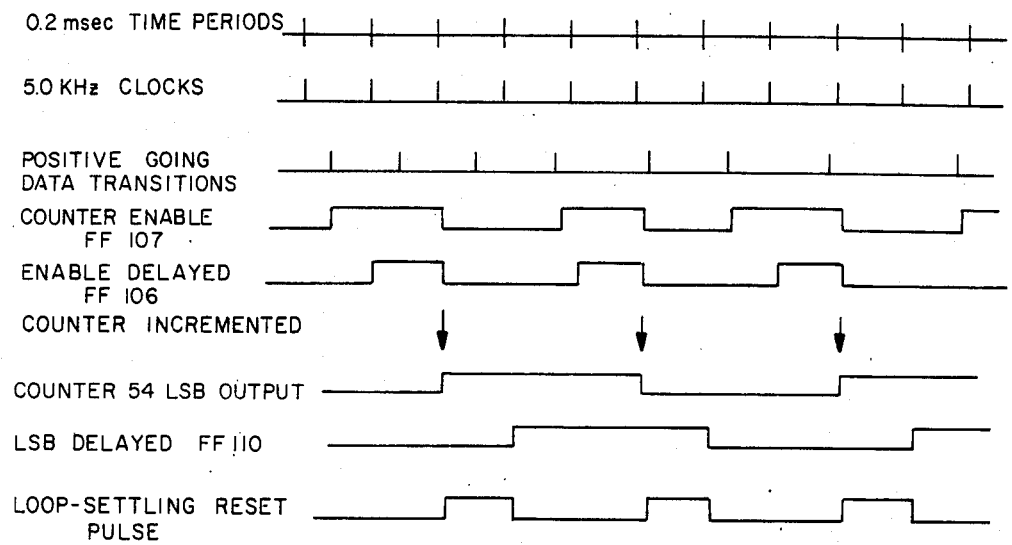

The voltage level from the D/A converter 50 is controlled by the state of modulo-two hundred fifty-six up/down counter 54. The counter 54 is clocked by the low frequency clock 56, but is prevented from being incremented at more than once every third such clock time by the digital one-shot circuit 60. This timing, shown in FIG. 6, allows the phase-locked loop 34 to settle following a voltage change in converter 50 for 0.2 milliseconds before the next clock/data phase comparison is permitted.

The counter 54 is incremented by every third low frequency clock by a positive data transition setting the enable input terminal of counter 54 and an ENABLE DELAYED flip flop 106 during the previous two clock periods. The ENABLE DELAYED flip flop 106 inserts a one clock period delay in the counter enable path in order to synchronize the enable pulse with the low fequency pulse from clock 56. During the 0.2 millisecond period immediately following each counter update, a COUNTER ENABLE flip flop 107 is held reset by an Exclusive OR gate 108 that detects that the least significant bit (LSB) of counter 54 has just changed. For this purpose, the LSB output of counter 54 is delayed for one clock interval through an LSB DELAYED flip flop 110, the output of which is provided to the Exclusive OR gate 108 along with the LSB output of counter 54 to produce the loop-settling time interval.

Incoming data to the mid-bit corrector circuit 42 is clocked into a flip flop 114 by the I CLOCK signal occurring at mid-bit, then delayed a half-bit time through a flip flop 116, which is clocked by the Q CLOCK signal. The sampled data received in flip flop 114 is furnished over conductor 84 to the convolutional encoder circuit E. Whenever a data transition occurs, the flip flops 114 and 116 are out of phase for a half-bit interval. A TRANSITION AND gate 118 detects positive-going transitions which are clocked into the COUNTER ENABLE flip flop 107 by the Q CLOCK signal, provided the reset pulse generated during the loop settling interval is not present. Thus, at the first positive transition after the reset pulse appears, the COUNTER ENABLE flip flop 107 is set.

To determine whether the phase of the oscillator 44 should be advanced or retarded, data is clocked into a flip flop 122 by the Q CLOCK signal. If transitions occur early (indicated in solid lines in FIG. 7), flip flop 122 changes state a half-bit time before flip flop 114. If transitions are late (indicated by phantom lines in FIG. 7), flip flop 122 changes state a half-bit time after flip flop 114. This phasing of flip flops 122 and 114 is compared in an UP/DOWN AND gate 124. A logic zero at Q CLOCK time calls for a clock phase advance, while a logic one at this time interval calls for a phase delay.

The state of the UP/DOWN gate 124 at Q CLOCK time is monitored by a flip flop 126. When a positive transition is detected by the counter enable flip flop 107, the latest up/down gate information is stored in flip flop 126 and preserved against subsequent changes by the counter enable flip 107 which changes state at the same Q CLOCK time. A true state in the next counter enable flip flop cycle allows the UP/DOWN counter 54 to be incremented by the next low frequency clock pulse, with the state of flip flop 126 controlling whether the count is to be advanced or retarded.

After the phase-locked loop 34 achieves the correct clock/data phasing, the counter 54 alternates between an up command and a down command on successive cycles. When a new set of clock and data channels is selected, a maximum of two hundred fifty five new counts is required by the counter 54 before phasing is achieved. When positive data transition occurs often as one in any 0.3 millisecond time intervals, the loop 34 acquires proper phasing within one hundred fifty three milliseconds, even if all of the maximum two hundred fifty five counts are required.

In the override search logic ciruits 64, a digital counter 128 counts up to twelve low frequency clock pulses unless reset by a positive data transition furnished from ENABLE DELAYED flip flop 106 through an OR gate 130. The OR gate 130 also functions to provide a reset signal to counter 128 from the Exclusive OR gate 108 indicating a change in the least significant bit of the counter 54.

Tests have been conducted on the processing circuit P of the present invention using input data and clock signals whose parameters have been varied to simulate worst case timing conditions. A set of input signal parameters is listed below, together with test results as compared to interface specification limits.

| TEST CONDITIONS (USING ALL COMBINATIONS OF EACH PARAMETER) | |
|---|---|
| FREQUENCY: | 50 Mbps |
| CLOCK ASYMMETRY: | ± 30% |
| CLOCK RISE/FALL TIME: | 6 ns |
| CLOCK LEVELS: | $V_1 = 3.7/6.3$ V |
|  | $V_0 = -0.3/1.5$ V |
| PHASE OFFSET REFERRED TO DATA: | ±270° |
| PHASE JITTER REF. TO DATA AT 1000 HZ RATE: | 2.5 ns P-P (peak to peak) |
| DATA RISE/FALL TIME: | 6 ns |
| DATA LEVELS: | $V_{1LT} = 4.5/6.5$ V |
|  | $V_{0LT} = -0.5/0.5$ V |
| DATA PATTERN: | SQUAREWAVE (1/2 RATE) |

|  | TEST RESULTS | SPEC. LIMIT |
|---|---|---|
| INPUT DATA ASYMMETRY (ADJUSTED UNTIL OCCURRENCE OF FIRST ERROR) | 25% | ≧17% |
| CONVOLUTED DATA OUTPUT PATTERN (20-BIT RECURRING) | 0101010101-1010101010 | 0101010101-1010101010 |
| OUTPUT DATA ASYMMETRY | 2% | ≦7% |

The foregoing disclosure and description of the invention are illustrative and explanatory thereof, and various changes in the size, shape, materials, components, circuit elements, wiring connections and contacts, as well as in the details of the illustrated construction may be made without departing from the spirit of the invention.

I claim:

1. A circuit for correcting input parameter variations in incoming signals of simultaneously transmitted but separately propagated data and clock pulse bits and for convolutionaly encoding the corrected signal, comprising:
   (a) corrector means for providing a series of corrected data pulses at the incoming data rate to an encoder, wherein the corrector means comprises;
      (1) means for receiving the incoming clock pulse bits;
      (2) means for forming from the received clock pulse bits a regenerated clock signal, said forming means having frequency adjustment means whereby, frequency of regenerated clock signal is adjusted to coincide with the received clock signal;
      (3) means for receiving the data pulse bits;
      (4) phase adjusting means for adjusting the phase of the regenerated clock signal relative to the received data signal to maintain phase coincidence;
      (5) mislock detector means for detecting and correcting a possible mislock condition whenever the phase adjustment means and the frequency adjustment means cooperate to create a false frequency lock between the received clock pulses and the regenerated clock signal,
   (b) a convolutional encoder for encoding a series of digital data pulses, comprising:
      (1) means for receiving the series of data pulses;
      (2) means for encoding the series of data pulses to produce an encoded data stream wherein each bit of the series of data pulses is represented by two bits of the encoded data stream, and wherein the means for encoding further comprises;
      (3) main register means for receiving and storing a series of a plurality of data pulses in corresponding number of shift register stages;
      (4) first means for modulo-two adding the contents of a first group of selected ones of the shift register stages;
      (5) second means for modulo-two adding the contents of a second group of selected ones of the shift register stages, said first and second groups being equal in number and differing from each other by at least one shift register stage;
      (6) storage means for separately and serially loading the outputs of said first and second means for modulo-two adding;
      (7) parallel register means for parallel loading the contents of said storage means;
      (8) said parallel register means further comprising means for serially transferring out the signals stored therein as coded digital data pulses.

2. The circuit of claim 1, further including: adaptive threshold detector means for generating a reference voltage for incoming data pulses for said means for receiving.

3. The circuit of claim 2, wherein said adaptive threshold detector means comprises:
   (a) means for detecting input logic high levels in the incoming data bits;
   (b) means for detecting input logic low levels in the incoming data bits;
   (c) means for averaging the detected input logic high and low levels to form the generated reference voltage.

4. The circuit of claim 1, wherein said means for forming a regenerated clock signal comprises: phase locked loop means.

5. The circuit of claim 4, wherein said phase locked loop means includes: means for converting the frequency of the clock pulses to a multiple of the received clock pulse frequency.

6. The circuit of claim 4, wherein said phase adjusting means includes:
   (a) phase locked loop means, and
   (b) mid-bit corrector circuit means.

7. The circuit of claim 6, wherein said phase adjusting means includes:
   (a) counter means for storing a count representing the present amount of phase adjustment to achieve phase coincidence between the incoming data signal and the regenerated clock signal;
   (b) converter means for forming a signal amplitude proportional to the stored count in said counter means and for furnishing the signal amplitude to control said frequency adjusting means.

8. The circuit of claim 7, wherein said means for sampling includes:
   (a) means for detecting in the received data pulses the occurrence of a data transition and for storing a data transition signal representative of such data transition; and
   (b) means for detecting the phase relationship of the regenerated clock signal with respect to the data transition signal at the occurrence of the transition.

* * * * *